United States Patent
Wu et al.

[11] Patent Number: 6,013,559
[45] Date of Patent: Jan. 11, 2000

[54] METHOD OF FORMING TRENCH ISOLATION

[75] Inventors: Kun-Lin Wu, Taichung; Horng-Bor Lu, Hsinchu, both of Taiwan

[73] Assignee: United Microelectronics Corp., Taipei, Taiwan

[21] Appl. No.: 09/172,465

[22] Filed: Oct. 14, 1998

[30] Foreign Application Priority Data

Jul. 17, 1998 [TW] Taiwan ................................. 87111661

[51] Int. Cl.$^7$ .................................................. H01L 21/76
[52] U.S. Cl. ......................... 438/424; 438/427; 438/435; 438/692; 148/DIG. 50
[58] Field of Search .................................. 438/424, 427, 438/435, 437, 692; 148/DIG. 50

[56] References Cited

U.S. PATENT DOCUMENTS

| | | | |
|---|---|---|---|
| 5,726,090 | 3/1998 | Jang et al. | 438/435 |
| 5,728,621 | 3/1998 | Zheng et al. | 438/427 |
| 5,731,241 | 3/1998 | Jang et al. | 438/437 |
| 5,851,899 | 12/1998 | Weigand | 438/427 |
| 5,923,993 | 7/1999 | Sahota | 438/424 |

*Primary Examiner*—Trung Dang
*Attorney, Agent, or Firm*—Thomas, Kayden, Horstemeyer & Risley

[57] ABSTRACT

A method of fabricating a trench isolation structure in a semiconductor devices. First, a mask layer is formed on a substrate and patterned. Then, a trench is formed in the substrate using the mask layer as a mask. An insulating layer is formed under the mask layer to fill the trench. The insulating layer is polished to expose a portion of the mask layer and an insulating plug is left in the trench. A RTP is performed to avoid mobile ions diffuse into the substrate. There are several operating conditions for the RTP. For example the operating temperature is ranged from about 600° C. to about 1300° C. The duration for performing the RTP is ranged from about 5 seconds to about 5 minutes. The operating gas can be selected from one of a group of $N_2$, $O_2$, or $N_2O$. Besides, before the RTP a cleaning step is performed using SC-1 or hydrogen fluoride (HF) solution as cleaning solution.

30 Claims, 4 Drawing Sheets

METHOD OF FORMING TRENCH ISOLATION

CROSS-REFERENCE TO RELATED APPLICATION

This application claims the priority benefit of Taiwan application serial no. 87111661, filed Jul. 17, 1998, the full disclosure of which is incorporated herein by reference.

BACKGROUND OF THE INVENTION

1. Field of Invention

The present invention relates to a method of manufacturing a semiconductor device. More particularly, the present invention relates to a method of forming shallow trench isolation (STI) in a semiconductor device.

2. Description of Related Art

An isolation structure, such as a shallow trench isolation structure, is introduced to prevent adjacent metal oxide semiconductor devices from short circuit occurring. A traditional method of forming a shallow trench isolation structure in a substrate is an anisotropic dry etching process. The formed trenches are filled with oxides, by which isolation regions for devices are formed.

A conventional method tor fabricating a trench isolation structure is illustrated as followed.

Referring to FIG. 1A, a pad oxide layer 12 with thickness of about 100~500 Å and a silicon nitride layer 14 with thickness of about 1000~3000 Å are sequentially formed on a substrate 10. The silicon nitride layer 14 above the pad oxide layer 12 is formed by, for example chemical vapor deposition (CVD). Next, the silicon nitride layer 14 is patterned by a photolithography process and an anisotropic etching process to define trenches. An etching process, such as an anisotropic etching process, is performed upon the substrate 10 using the silicon nitride layer 14 as a mask, in which a trench 15 with depth of about 3000~10000 Å is formed therein. Then, an insulating layer 16. such as a silicon dioxide layer, is deposited over the substrate 10 and the trench 15 is filled therewith.

Next, referring to FIG. 1B, the insulating layer 16 is polished by, for example, chemical mechanical polishing (CMP), and insulating plugs 16a are formed in the substrate 10 to be used for trench isolation. After the substrate 10 is performed by a CMP process a phenomenon of micro-scratch occurs on the surface of the insulating layer 16. Therefore referring to FIG. 1C, the substrate 10 is placed in a furnace to be performed by a furnace annealing process, by which the insulating layer 16 and the silicon nitride layer 14 are densified. The phenomenon of micro-scratch is therefore relieved in the later polishing process.

According to the above-described method for fabricating a STI structure, a detail description is illustrated in FIG. 2. At first, a pad oxide is formed on a substrate and a silicon nitride layer is then formed on the pad oxide layer. Then, using the silicon nitride layer as a mask trenches are formed by etching. The trench is filled with oxide by depositing an oxide layer on the substrate. The oxide layer is polished by CMP, by which only a portion of the oxide layer is left in the trench. Next, a furnace annealing process is performed on the substrate to densify the oxide layer and the silicon nitride layer, by which occurrence of micro-scratch is reduced in the later polishing process.

There are some drawbacks in the conventional method for trench isolation. It takes too much time for the furnace annealing process in the furnace. As well known, slurry used in CMP process contains mobile ions, such as potassium ion ($K^+$) or sodium ion ($Na^+$), that are left on the substrate. In case of performing a furnace annealing process for a long, time, the mobile ions are quickly diffused into the substrate and makes devices fail.

SUMMARY OF THE INVENTION

Accordingly, the present invention is to provide a manufacturing method of a trench isolation structure. A rapid thermal process (RTP) of the invention is performed, by which the conventional disadvantages of performing a furnace annealing are improved, thereby mobile ions are avoided to diffuse into the substrate and reliability and performance of devices are increased.

To achieve these and other advantages and in accordance with the purpose of the invention, as embodied and broadly described herein, the invention provides a method of forming a trench isolation structure. First, a mask layer is formed on a substrate and patterned. Then, a trench is formed in the substrate using the mask layer as a mask. An insulating layer is formed under the mask layer to fill the trench. The insulating layer is polished to expose a portion of the mask layer and an insulating plug is left in the trench. A RTP is performed to avoid mobile ions diffuse into the substrate. There are several operating conditions for the RTP. For example, the operating temperature is ranged from about 600° C. to about 1300° C. The duration for performing the RTP is ranged from about 5 seconds to about 5 minutes. The operating gas can be selected from one of a group of $N_2$, $O_2$, or $N_2O$. Before the RTP, a cleaning step is further performed using SC-1 or hydrogen fluoride (HF) solution as cleaning solution, by which the mobile ions, such as K or Na ion, are removed, and the layer with surface damage in a thickness of 50~510 Å caused by CMP is etched.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
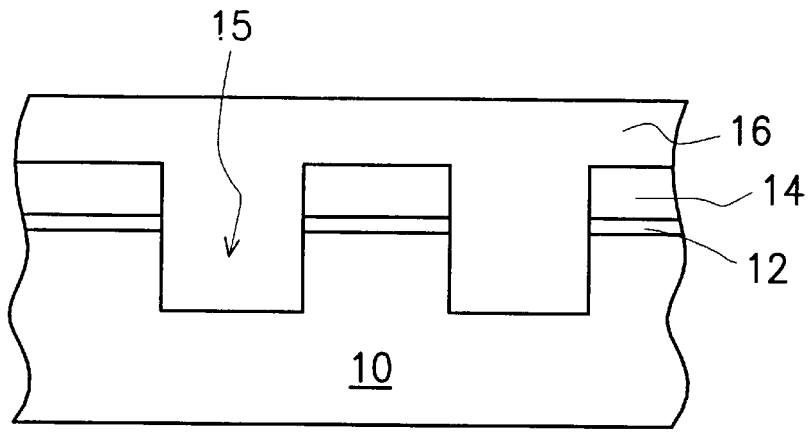
FIG. 1A to FIG. 1C are cross-sectional views showing, a conventional method of fabricating a trench isolation structure in a semiconductor device.
Figure 1B:
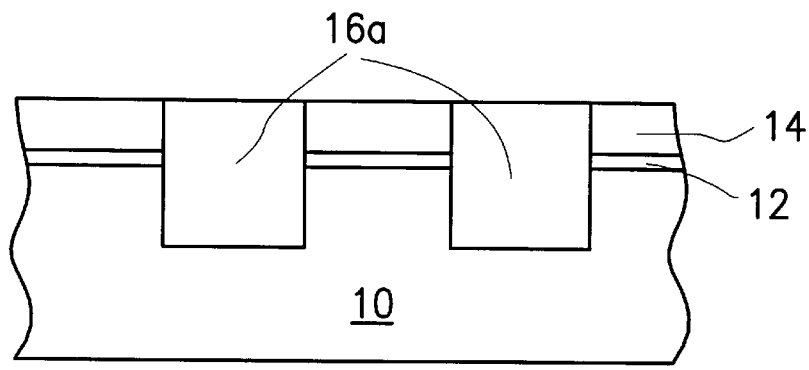
Figure 1C:
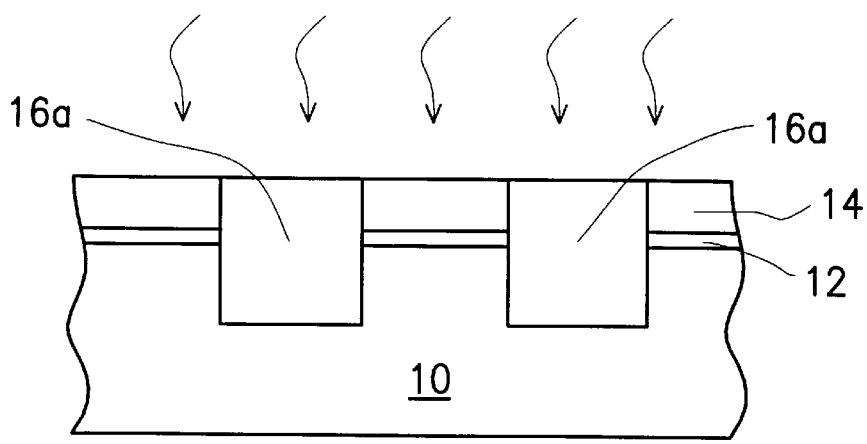
Figure 2:
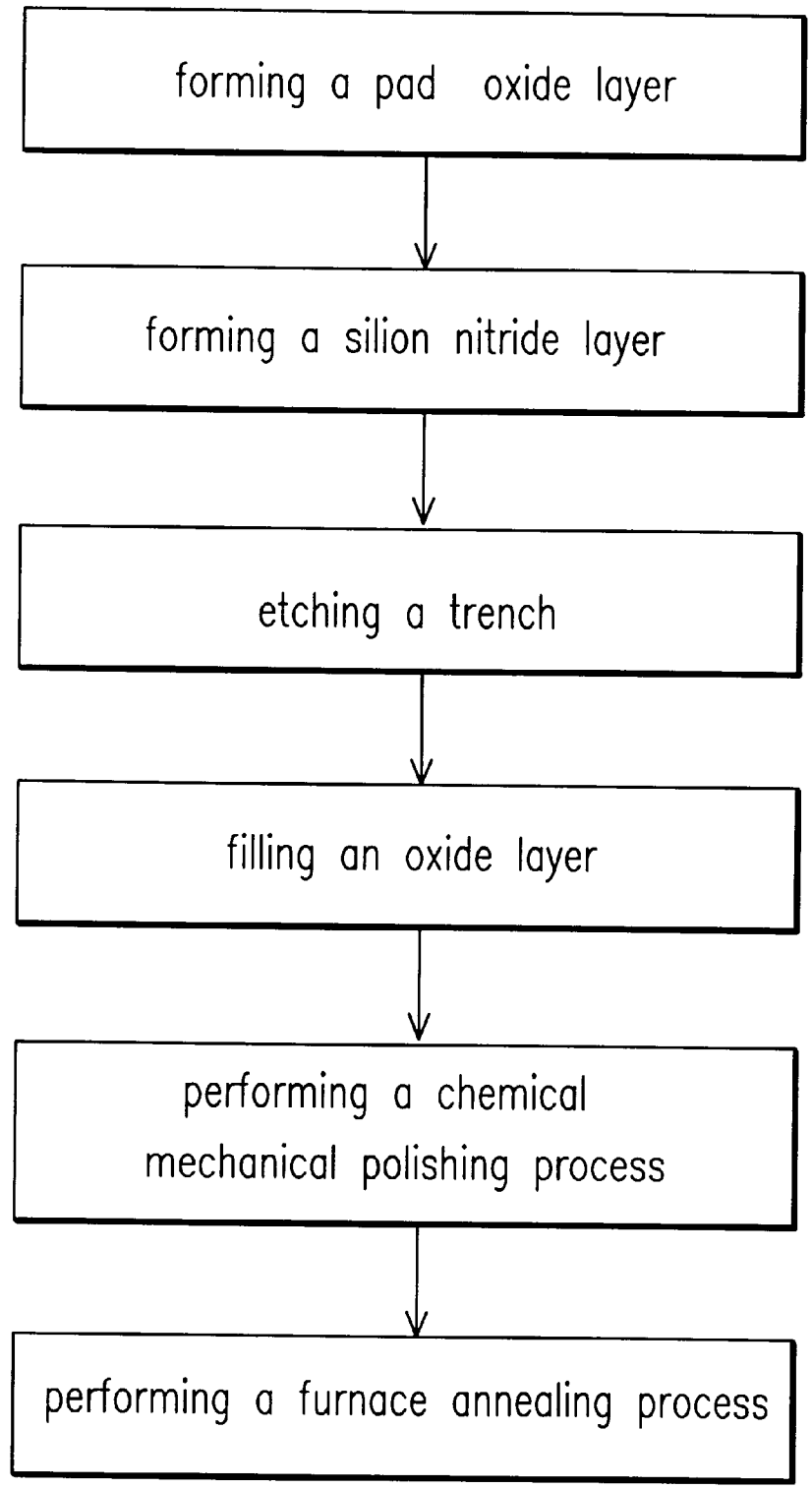
FIG. 2 is a flow chart showing a conventional method of fabricating a trench isolation structure as shown in FIG. 1A to FIG. 1C.

Reference will now be made in detail to the present preferred embodiments of the invention, examples of which are illustrated in the accompanying drawings. Wherever possible, the same reference numbers are used in the drawings and the description to refer to the same or like parts.

An important feature of the invention is that a rapid thermal process (RTP) is introduced in the process of densification. By using the RTP in the process of densification, it takes a short time, which is less than 5 minutes., by which diffusion of the mobile ions is avoided and reliability and performance of the devices are improved therewith. Furthermore, a cleaning step is performed after the RTP process. The cleaning solution is, for example, used SC-1 which are the mixture of $H_2O_2$, $NH_4OH$ and DI water with a proportion of 1:1:5 to 1:4:20, or hydrogen fluoride (HF) solution as cleaning solution. By using the cleaning step, the amount of the mobile ions on the surface of the substrate is efficiently reduced. Moreover, occurrence of micro-scratch caused by performing a cleaning step to remove the silicon nitride layer is reduced, by which the yield of the devices is increased.

Figure 3A:
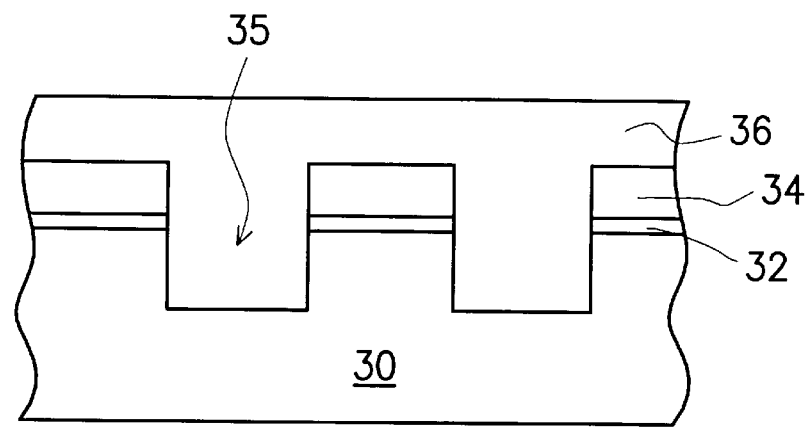
FIG. 3A to FIG. 3C are cross-sectional views showing a method of fabricating a trench isolation structure according to one preferred embodiment of this invention.
Figure 3B:
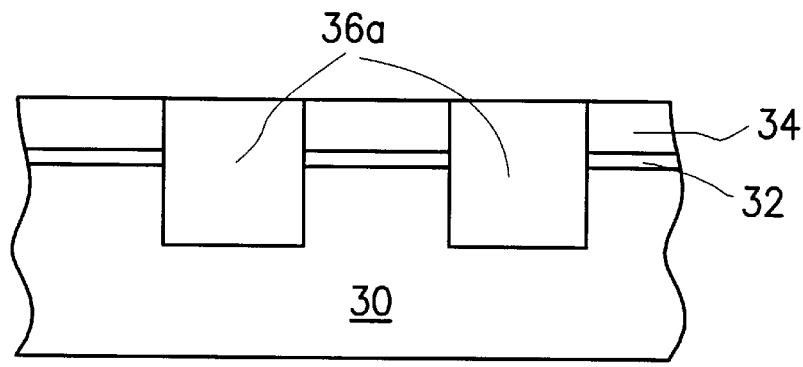
Figure 3C:
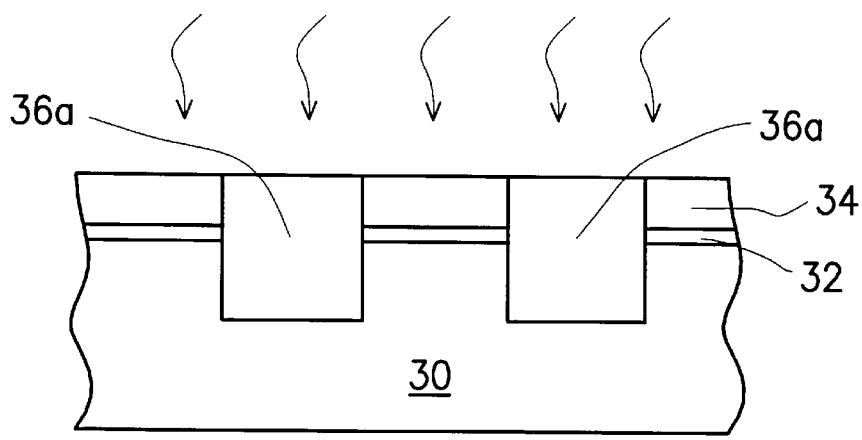

FIGS. 3A to 3C are cross-sectional views showing the processing steps in fabricating a trench isolation structure according to one preferred embodiment of the invention.

Referring to FIG. 3A, a pad oxide layer 32 with thickness of about 100~500 Å and a silicon nitride layer 34 with thickness of about 1000~3000 Å are sequentially formed on a substrate 30. The silicon nitride layer 34 above the pad oxide layer 12 is formed by, for example, chemical vapor deposition (CVD). Next, the silicon layer 34 is patterned by a photolithography process and an anisotropic etching process to define the location of the trench. An etching process, such as anisotropic etching process, is performed to etch the substrate 30 using the silicon nitride layer 34 as a mask, by which a trench 35 with depth of about 3000~10000 Å is defined in the substrate 30. Then, an insulating layer 36, for example, a silicon dioxide layer, is deposited over the substrate 30 and the trench 35 are filled therewith. The insulating layer 36 may be formed by a method of CVD, high density plasma-CVD (HDP), atmospheric pressure-CVD (APCVD) or SACVD (sub-atmosphere CVD) oxide. The trench 35 is filled with silicon dioxide in a circumstance full of TEOS gas.

Next, referring to FIG. 3B, the insulating layer 36 is polished, for example, by CMP, by which insulating plugs 36a for trench isolation are formed in the substrate 30 and active regions on the substrate 30 are formed between the insulating plugs 36a. After CMP being performed, micro-scratch occurs on the surface of the insulating layer 36. Therefore, referring, to FIG. 3C, a RTP is performed in order to densify the insulating layer 36 and the silicon nitride layer 34, by which occurrence of micro-scratch phenomenon in the later chemical cleaning process is reduced. The feature of the invention is using a RTP. There are several operating conditions for the RTP. For example, the operating temperature is ranged from about 600° C. to about 1300° C. The duration for operating the RTP is ranged from about 5 seconds to about 5 minutes. The operation gas can be selected from at least one of a group of $N_2$, $O_2$, and $N_2O$.

Some mobile ions generated by slurry of CMP usually exit on the substrate 30 while the CMP is finished. The mobile ions are, for example, K, Ca, Ti, Cr, Mn, Na, Fe ion and the like. The RTP of the invention will not cause the mobile ions mentioned above to diffuse into the substrate 30 because of short operating duration, by which reliability and performance of devices are maintained without being effected.

In addition, a further cleaning step is performed to remove and reduce the mobile ions on the substrate 30 before the RTP. The solutions can be, for example, SC-1 or HF solution. While the trench isolation structure of the invention is formed, a further step for forming transistors and metal interconnects can be performed thereon.

Figure 4:
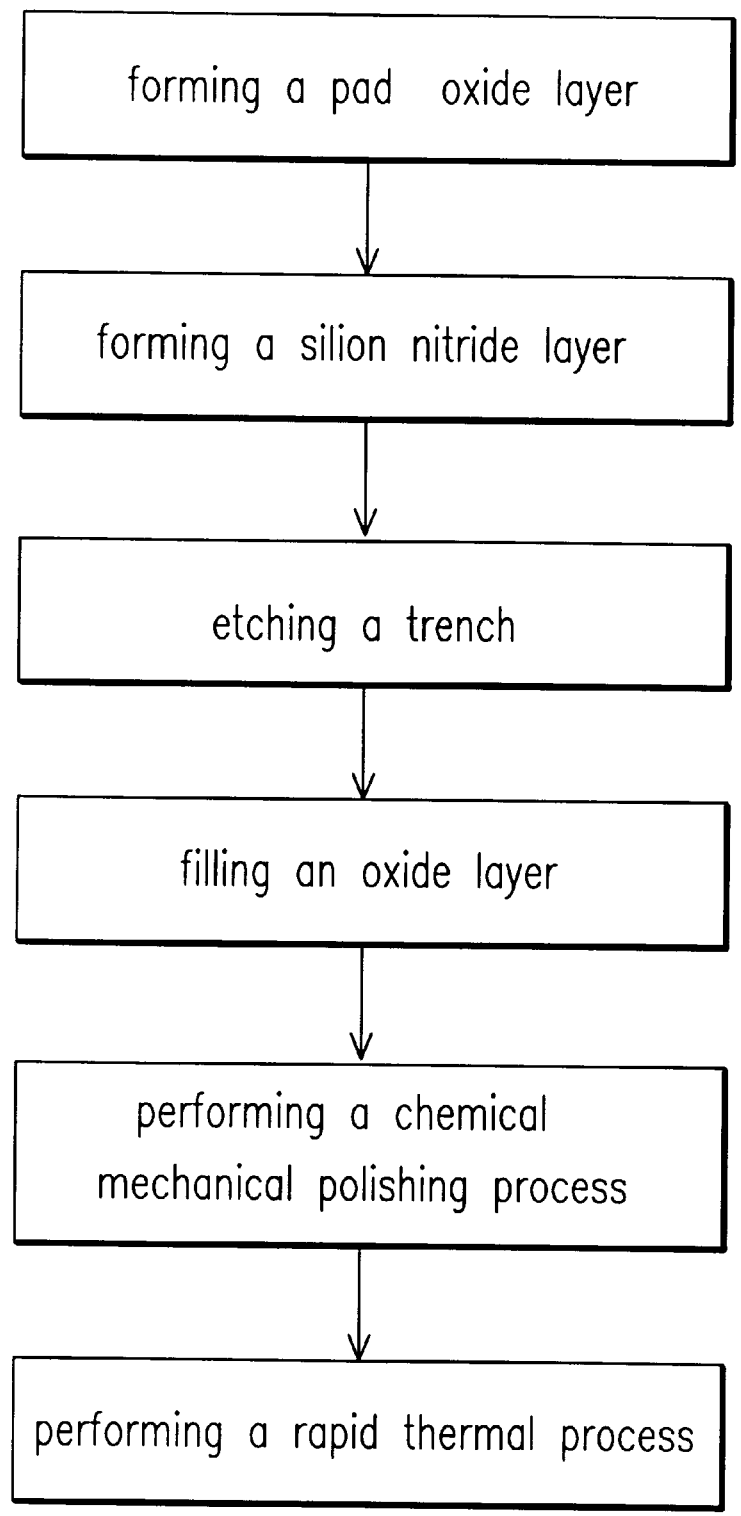
FIG. 4 is a flow chart showing a method of fabricating a trench isolation structure according to the preferred embodiment as shown in FIG. 3A to FIG. 3C.

Referring to FIG. 4, a detailed description of the embodiment as shown in FIGS. 3A to 3C is described here inafter. A pad oxide layer is formed on a substrate first, and a silicon nitride layer is formed on the pad oxide. Then, using the silicon nitride layer as a mask, a trench is formed by using an etching process. An oxide layer is formed over the substrate. The oxide layer is polished by CMP until only a portion of the oxide layer is left in the trench. Next, a RTP is performed to density the oxide layer and the silicon nitride layer, by which occurrence of micro-scratch phenomenon in the later polishing process is reduced. A cleaning step is further performed to remove and reduce the mobile ions on the substrate 30 before the RTP. The operating solution can be, for example. SC-1 or HF solution.

One feature of the invention is that using the RTP to perform densification, by which mobile ions can be avoided to diffuse into the substrate, thereby reliability and performance of devices can be increased.

Other feature of the invention is that using the RTP can efficiently reduce occurrence of micro-scratch phenomenon caused by, for example, removing the silicon nitride layer.

Another feature of the invention is that using the cleaning step and the RTP can reduce the amount of mobile ions on the surface of the substrate by which the damaged portion of about 50~500 Å in thickness ot the surface of the substrate can be removed. The cleaning solution is, for example, SC-1 solution or HF solution.

It will be apparent to those skilled in the art that various modifications and variations can be made to the structure of the present invention without departing from the scope or spirit ot the invention. In view of the foregoing, it is intended that the present invention cover modifications and variations of this invention provided they fall within the scope of the following claims and their equivalents.

What is claimed is:

1. A method of forming shallow trench isolation in a semiconductor device, comprising:

provideing a substrate, wherein a pad oxide layer is formed thereon;

forming a mask layer on the pad oxide layer, wherein the mask layer is defined by a predetermined pattern;

forming a trench in the substrate using the mask layer as a mask;

forming an insulating layer on the substrate wherein the trench is filled with the insulating layer;

polishing the insulating layer to expose the mask layer; and performing a rapid thermal process (RTP) in the substrate thereby mobile ions generated in the step of polishing the insulating layer are decreased.

2. A method according to claim 1, wherein the mask layer is a silicon nitride layer.

3. A method according to claim 1, wherein the step of forming the trench is by anisotropic dry etching.

4. A method according to claim 1, wherein the step of forming the insulating layer is by chemical vapor deposition (CVD), and the step of forming a silicon dioxide layer is in the circumstance full of tetra-ethyl-ortho-silicate (TEOS) gas.

5. A method according to claim 1, wherein the step of forming the insulating layer is by high density plasma-CVD (HDP-CVD), and the step of forming the silicon dioxide layer is in the circumstance full of TEOS gas.

6. A method according to claim 1, wherein the step of polishing is by chemical mechanical polishing.

7. A method according to claim 1, wherein the mobile ion is a potassium ion.

8. A method according to claim 1, wherein the mobile ion is a sodium ion.

9. A method according to claim 1, wherein the step of performing the rapid thermal process is under conditions which comprising:

a temperature ranged from about 600° C. to about 1300° C., a heating time from about 5 seconds to about 5 minutes, a gas introduced while heating, wherein the gas comprises nitrogen.

10. A method according to claim 9, wherein the gas further comprises oxygen.

11. A method according to claim 9, wherein the gas further comprises ammonia.

12. A method according to claim 9, wherein the gas further comprises $N_2O$.

13. A method according to claim 1, further comprising performing a cleaning step to remove the mobile ions before the RTP.

14. A method according to claim 13, wherein a cleaning solution used in the step of performing the cleaning step is SC-1 solution, which comprises $H_2O_2$, $NH_4OH$ and DI water with a proportion from 1:1:5 to 1:4:20.

15. A method according to claim 13, wherein the cleaning solution used in the step of performing the cleaning step is HF solution.

16. A method of forming shallow trench isolation in a semiconductor, comprising:

providing a substrate:

forming a mask layer on the substrate, wherein the mask layer is defined by a predetermined pattern;

forming a trench in the substrate using the mask layer as a mask;

forming an insulating layer on the substrate, wherein the trench is filled with the insulating layer;

polishing the insulating layer to expose the mask layer and an insulating plug left in the trench:

performing a rapid thermal process in the substrate, thereby mobile ions generated in the step of polishing the insulating layer are avoided to diffuse into the substrate, wherein the step of performing a RTP is under conditions which comprising:

a temperature ranged from about 600° C. to about 1300° C.;

a heating time from about 5 seconds to about 5 minutes;

a gas introduced while heating, wherein the gas comprising nitrogen; and forming a transistor and a metal-interconnect under the trench isolation structure.

17. A method according to claim 16, further comprising forming a pad oxide layer with thickness of 100~500 Å between the substrate and the mask layer.

18. A method according to claim 16, wherein the mask layer comprise a silicon nitride layer with the thickness of 1000~3000 Å.

19. A method according to claim 16, wherein the step of forming the trench is by anisotropic dry etching.

20. A method according to claim 16, wherein the step of forming the insulating layer is by chemical vapor deposition, and the step of forming a silicon dioxide layer is in the circumstance full of TEOS gas.

21. A method according to claim 16, wherein the step of forming an insulating layer is by HDP-CVD, and the step of forming a silicon dioxide layer is in a circumstance full of TEOS gas.

22. A method according to claim 16, wherein the step of polishing is by chemical mechanical polishing.

23. A method according to claim 16, wherein the mobile ion is a potassium ion.

24. A method according to claim 16, wherein the mobile ion is a sodium ion or metal ions.

25. A method according to claim 16, further comprising performing a cleaning step to remove the mobile ions before the RTP.

26. A method according to claim 25, wherein a cleaning solution used in the step of performing the cleaning step is SC-1 solution, which comprises $H_2O_2$, $NH_4OH$ and DI water with a proportion from 1:1:5 to 1:4:20.

27. A method according to claim 25, wherein cleaning solution used in the step of performing the cleaning step is HF solution.

28. A method according to claim 16, wherein the gas further comprises oxygen.

29. A method according to claim 16, wherein the gas further comprises ammonia.

30. A method according to claim 16, wherein the gas further comprises $N_2O$.

* * * * *